(12) United States Patent
Yang (10) Patent No.: US 11,798,602 B1
(45) Date of Patent: Oct. 24, 2023

(54) DATA RECEIVING CIRCUIT WITH LATCH AND EQUALIZER

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/741,884

(22) Filed: May 11, 2022

(51) Int. Cl.
*G11C 7/10* (2006.01)

(52) U.S. Cl.
CPC ............ *G11C 7/1087* (2013.01); *G11C 7/109* (2013.01); *G11C 2207/12* (2013.01)

(58) Field of Classification Search
CPC .... G11C 7/1087; G11C 7/109; G11C 2207/12
See application file for complete search history.

(56) References Cited

U.S. PATENT DOCUMENTS

| 8,208,327 | B2 | 6/2012 | Pyo |
| 10,665,292 | B1 | 5/2020 | Raad et al. |
| 2002/0180491 | A1 | 12/2002 | Song et al. |
| 2009/0268538 | A1* | 10/2009 | Fukushima ......... G11C 13/004 365/207 |

OTHER PUBLICATIONS

U.S. Office Action dated Jan. 6, 2023 from the US in U.S. Appl. No. 17/741,598 and the search report attached to the Office Action. pp. 1-16.
Taiwanese Office Action dated Feb. 24, 2023 in application 111125412 and the search report attached to the Office Action; pp. 1-6.

* cited by examiner

*Primary Examiner* — Sultana Begum
(74) *Attorney, Agent, or Firm* — Muncy, Geissler, Olds & Lowe (57) ABSTRACT

A data receiving circuit is provided. The data receiving circuit includes a data input circuit, a latch circuit, and an equalizer. The data input circuit is configured to receive an input signal, and the latch circuit is connected to the data input circuit and configured to output an output signal in response to the input signal. The equalizer includes a first transistor having a source connected to latch circuit; and a second transistor having a source connected to the latch circuit and a gate connected to a gate of the first transistor.

11 Claims, 7 Drawing Sheets

DATA RECEIVING CIRCUIT WITH LATCH AND EQUALIZER

TECHNICAL FIELD

The present disclosure relates to a data receiving circuit, and more particularly, to a data receiving circuit having an equalizer.

DISCUSSION OF THE BACKGROUND

In memory devices, input receivers are widely used to receive input signals. However, as requirements for the operation speed of memory devices are getting higher and higher, input receivers may not be able to keep up, resulting in a small margin to correctly determine input data. In the event that input data is incorrectly interpreted, memory devices may crash or operate abnormally.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a data receiving circuit. The data receiving circuit includes a data input circuit, a latch circuit, and an equalizer. The data input circuit is configured to receive an input signal. The latch circuit is connected to the data input circuit and configured to output an output signal in response to the input signal. The equalizer is connected to the latch circuit and configured to provide a first voltage at a first node and a second voltage at a second node at an equalizing stage. The first voltage is different from the second voltage Another aspect of the present disclosure provides a data receiving circuit. The data receiving circuit includes a data input circuit, a latch circuit, and an equalizer. The data input circuit is configured to receive an input signal. The latch circuit is connected to the data input circuit and configured to output an output signal in response to the input signal. The equalizer includes a first transistor and a second transistor. The first transistor has a source connected to latch circuit. The second transistor has a source connected to the latch circuit and a gate connected to a gate of the first transistor.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1A:
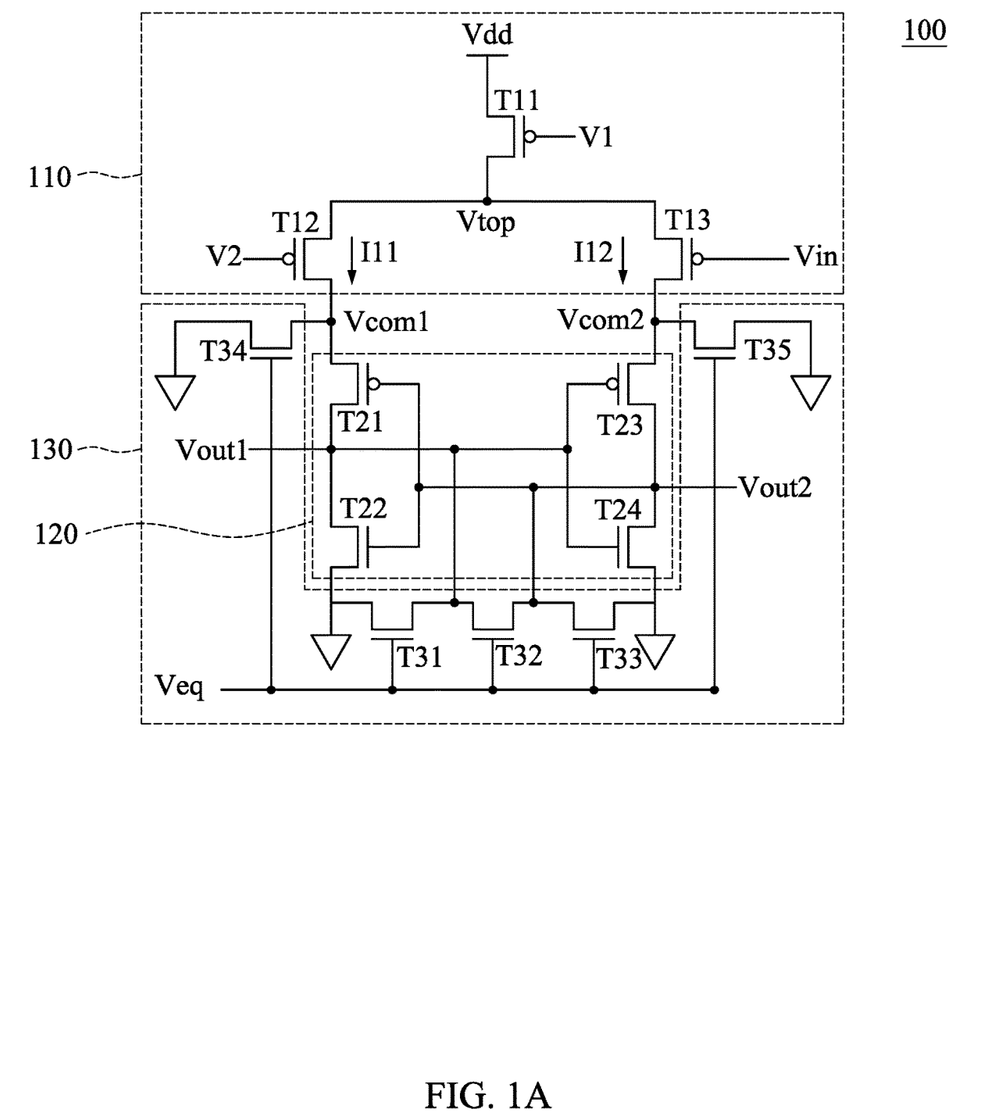
FIG. 1A is a schematic diagram illustrating a data receiving circuit, in accordance with some embodiments of the present disclosure.

FIG. 1A is a schematic diagram illustrating a data receiving circuit 100 (or a data receiver) in accordance with some embodiments of the present disclosure. The data receiving circuit 100 includes an input circuit 110, a latch circuit 120, and an equalizer 130. In some embodiments, the data receiving circuit 100 may be or may include a sense amplifier. In some embodiments, the input circuit 110 and the latch circuit 120 may be collectively referred to as a sense amplifier.

The input circuit 110 includes transistors T11, T12, and T13. In some embodiments, the transistors T11, T12, and T13 are P-type metal-oxide-semiconductor (PMOS) transistors. A source of the transistor T11 is connected to receive a supply voltage Vdd. A gate of the transistor T11 is connected to receive a clock signal V1. A drain of the transistor T11 is connected to a source of the transistor T12 and a source of the transistor T13. A gate of the transistor T12 is connected to receive a reference signal (or reference voltage) V2. A drain of the transistor T12 is connected to the latch circuit 120 (e.g., to a source of the transistor T21). A gate of the transistor T13 is connected to receive an input signal Vin. A drain of the transistor T13 is connected to the latch circuit 120 (e.g., to a source of the transistor T23). In some embodiments, the reference signal V2 has a voltage level in a range from about 0.1 Vdd to about 0.42 Vdd. In other embodiments, the reference signal V2 may have other voltage levels depending on design requirements. In some embodiments, the input signal Vin has a voltage level in a range from about −0.2V to about Vdd+0.2V. In other embodiments, the input signal Vin may have other voltage levels depending on design requirements.

The latch circuit 120 may include two inverters in which an output of one inverter is connected to an input of the other inverter. As shown in FIG. 1A, the latch circuit 120 includes transistors T21, T22, T23, and T24. The transistors T21 and T22 define an inverter while the transistors T23 and T24 define the other inverter. The transistors T21 and T23 are PMOS transistors and the transistors T22 and T24 are N-type metal-oxide-semiconductor (NMOS) transistors.

A source of the transistor T21 is connected to the drain of the transistor T12. A gate of the transistor T21 is connected to a gate of the transistor T22, a drain of the transistor T23, and a drain of the transistor T24. A drain of the transistor T21 is connected to a drain of the transistor T22. A source of the transistor T22 is connected to a common voltage (e.g., ground). The drain of the transistor T21 and the drain of the transistor T22 may function as an output Vout1 of the data receiving circuit 100.

A source of the transistor T23 is connected to the drain of the transistor T13. A drain of the transistor T23 is connected to a drain of the transistor T24. A source of the transistor T24 is connected to the common voltage (e.g., ground). The drain of the transistor T23 and the drain of the transistor T24 may function as an output Vout2 of the data receiving circuit 100.

The equalizer 130 includes transistors T31, T32, T33, T34, and T35. In some embodiments, the transistors T31, T32, T33, T34, and T35 are NMOS transistors. Gates of the transistors T31, T32, T33, T34, and T35 are connected to each other to receive an equalizing signal Veq. A source of the transistor T31 is connected to the common voltage (e.g., ground). A source of the transistor T33 is connected to the common voltage (e.g., ground). A source of the transistor T34 is connected to the common voltage (e.g., ground). A source of the transistor T35 is connected to the common voltage (e.g., ground). The transistor T32 is connected between the transistors T31 and T33.

Figure 1B:
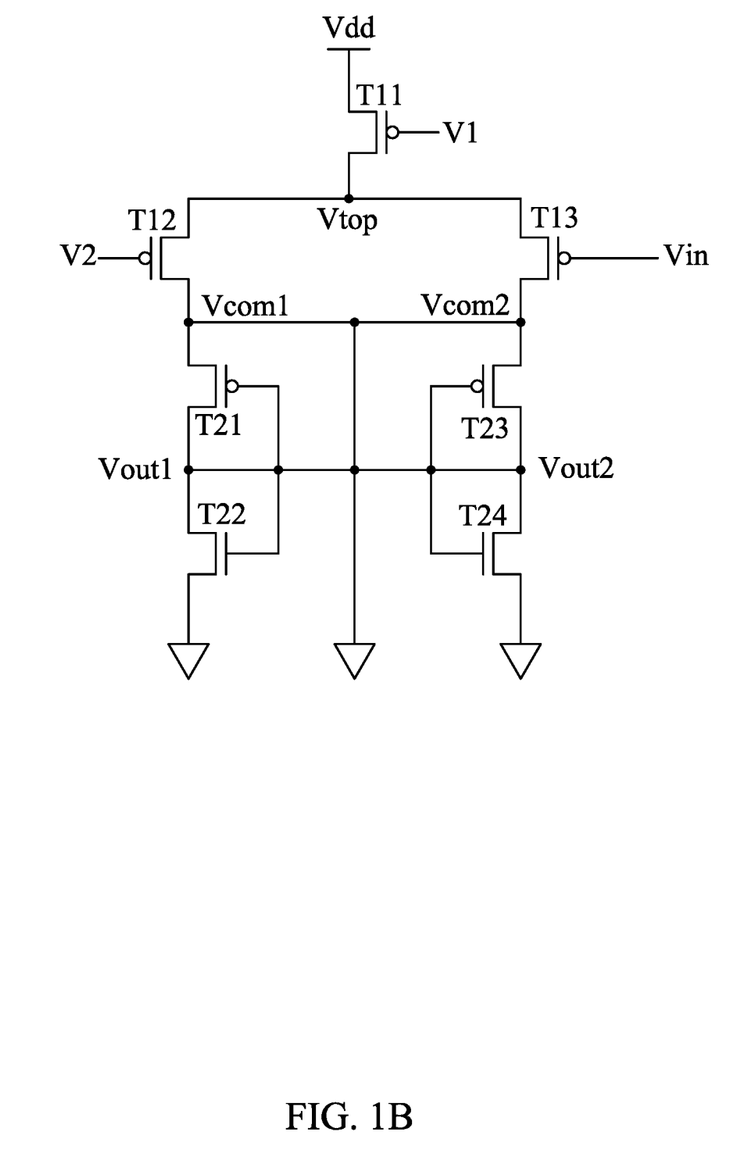
FIG. 1B illustrates an equivalent circuit of the data receiving circuit as shown in FIG. 1A, in accordance with some embodiments of the present disclosure.

In some embodiments, when the data receiving circuit 100 is configured to operate at an equalizing stage, the equalizer 130 is enabled. The equalizing signal Veq with a high logic level (e.g., logical value "1") is inputted to the gates of the transistors T31, T32, T33, T34, and T35 to turn on those transistors. Thus, the voltages Vcom1 at the drain of the transistor T12, Vcom2 at the drain of the transistor T13, Vout1, and Vout2 would be pulled down to the common voltage (e.g., ground) as shown in FIG. 1B, which illustrates an equivalent circuit of the data receiving circuit 100 operating in the equalizing stage.

Figure 1C:
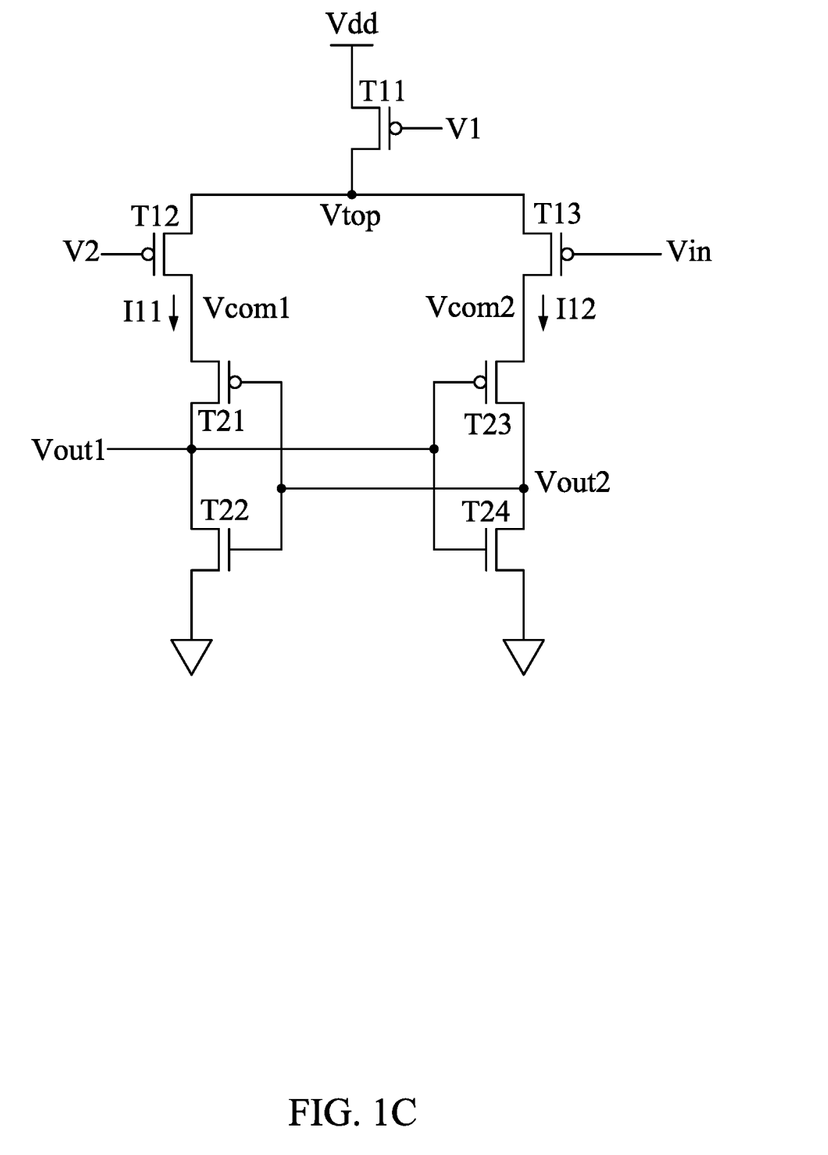
FIG. 1C illustrates an equivalent circuit of the data receiving circuit as shown in FIG. 1A, in accordance with some embodiments of the present disclosure.

After the equalizing stage is completed, the equalizing signal Veq with a low logic level (e.g., logical value "0") is inputted to the gates of the transistors T31, T32, T33, T34, and T35 to turn off those transistors. The equalizer 130 is turned off or disable. FIG. 1C illustrates an equivalent circuit of the data receiving circuit 100 operating in this stage, in accordance with some embodiments of the present disclosure.

In the case that an input signal Vin having a high logic level (e.g., logical value "1") is inputted to the gate of the transistor T13, the voltage Vtop at the drain of the transistor T11 (or at the source of the transistor T12 or T13) starts rising. For example, the voltage Vtop is pulled up. The voltage Vcom1 at the drain of the transistor T12 (or at the source of the transistor T21) starts rising as well. For example, the voltage Vcom1 is pulled up. The voltage Vcom2 at the drain of the transistor T13 (or at the source of the transistor T23) starts rising as well. For example, the voltage Vcom2 is pulled up.

Since the voltage (e.g., the input signal Vin) at the gate of the transistor T13 is higher than the voltage (e.g., the reference signal V2) at the gate of the transistor T12, a current I11 flowing through the transistor T12 is larger than a current I12 flowing through the transistor T13. After a sufficient period of time, the transistor T21 is fully turned on. Since the voltage at the gates of the transistors T21 and T22 has been pulled down to the common voltage (e.g., ground) during the sensing stage, the transistors T21 and T24 are fully turned on and the transistors T22 and T23 are fully turned off. Therefore, the voltage Vout1 at the drains of the transistors T21 and T22 (or at the gates of the transistors T23 and T24) starts rising. For example, the voltage Vout1 is pulled up.

The data receiving circuit 100 is configured to output the voltage Vout1 having a high logic level (e.g., logical value "1") if the voltage of the input signal Vin is higher than the voltage of the reference signal V2; and the data receiving circuit 100 is configured to output the voltage Vout1 having a low logic level (e.g., logical value "0") if the voltage of the input signal Vin is lower than the voltage of the reference signal V2.

Figure 1D:
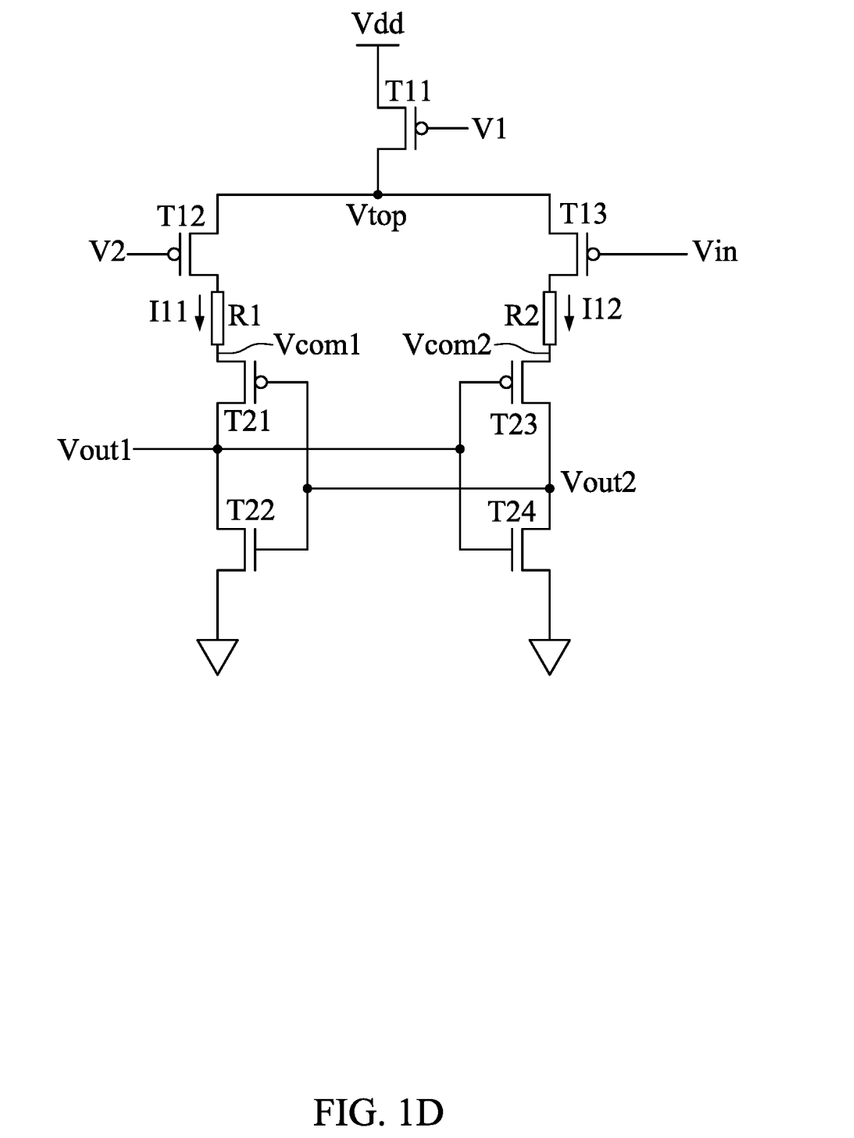
FIG. 1D illustrates an equivalent circuit of the data receiving circuit as shown in FIG. 1C, in accordance with some embodiments of the present disclosure.

FIG. 1D illustrates an equivalent circuit of the data receiving circuit 100 as shown in FIG. 1C, in accordance with some embodiments of the present disclosure. In FIG. 1D, the resistor R1 may represent an equivalent resistor of a conductive wire connecting between the drain of the transistor T12 and the source of the transistor T21, and the resistor R2 may represent an equivalent resistor of a conductive wire connecting between the drain of the transistor T13 and the source of the transistor T23.

In some embodiments, if the value of the resistor R1 is substantially equal to the value of the resistor R2, the data receiving circuit 100 may function normally. However, due to deviations in manufacturing processes, a mismatch between the resistor R1 and the resistor R2 may occur. For example, a deviation of the threshold voltage (Vth) of the transistor T12 (or T13) and/or the transistor T21 (or T13) may cause a mismatch between the resistor R1 and the resistor R2. For example, a deviation of metal lines, conductive contacts, conductive vias connecting the drain of the transistor T11 (or T13) and the source of the transistor T21 (or T23) may cause a mismatch between the resistor R1 and the resistor R2. The voltage Vcom1 is equal the voltage Vtop minus the voltage drop across the resistor R1 (i.e., I11×R1). If the value of the resistor R1 increases due to deviations in manufacturing processes, the voltage Vcom1 decreases, which would equivalently raise the voltage level of the reference signal V2 as originally designed. This would reduce the data eye of the output data (e.g., Vout1 and Vout2) of the receiving circuit 100, causing the data receiving circuit 100 to operate abnormally. For example, if the value of the resistor R1 is 40Ω greater than that of the resistor R2, the data eye of the output data (e.g., Vout1 and Vout2) of the receiving circuit 100 may drop by around 40 mV.

Figure 2A:
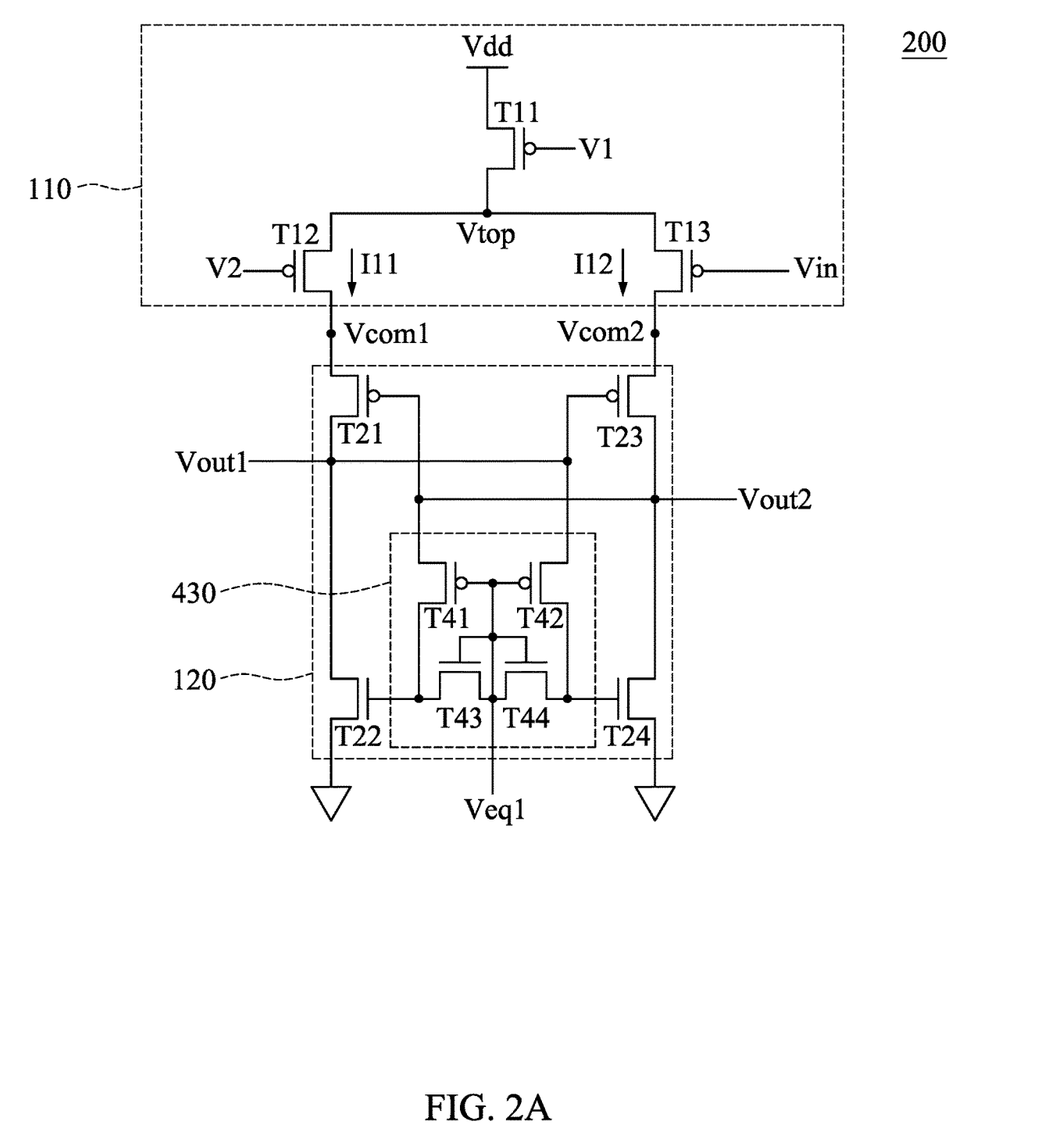
FIG. 2A is a schematic diagram illustrating a data receiving circuit, in accordance with some embodiments of the present disclosure.

FIG. 2A is a schematic diagram illustrating a data receiving circuit 200 (or a data receiver), in accordance with some embodiments of the present disclosure. The data receiving circuit 200 is similar to the data receiving circuit 100 as illustrated in FIG. 1A, except that in FIG. 2A, the equalizer 130 is replaced by the equalizer 430. In some embodiments, the data receiving circuit 200 may be or may include a sense amplifier.

The equalizer 430 is connected between the gates of the transistors T21, T22, T23, and T24. The equalizer 430 includes transistors T41, T42, T43, and T44. In some embodiments, the transistor T41 is a PMOS transistor. In some embodiments, the transistor T42 is a PMOS transistor. In some embodiments, the transistor T43 is a NMOS transistor. In some embodiments, the transistor T44 is a NMOS transistor.

The source of the transistor T41 is connected to the gate of the transistor T21, the drain of the transistor T23, and the drain of the transistor T24. The drain of the transistor T41 is connected to the gate of the transistor T22 and the source of the transistor T43. The gate of the transistor T41 is connected to the gate of the transistor T42, the gate of the transistor T43, and the gate of the transistor T44. In other words, the gates of the transistors T41, T42, T43, and T44 are connected to each other to receive an equalizing signal Veq1.

The source of the transistor T42 is connected to the gate of the transistor T23, the drain of the transistor T21, and the drain of the transistor T22. The drain of the transistor T42 is connected to the gate of the transistor T24 and the source of the transistor T44.

The source of the transistor T43 is connected to the gate of the transistor T22 and the drain of the transistor T41. The drain of the transistor T43 is connected to the drain of the transistor T44 and the gates of the transistors T41, T42, T43, and T44.

The source of the transistor T44 is connected to the gate of the transistor T24 and the drain of the transistor T42. The drain of the transistor T44 is connected to the drain of the transistor T43 and the gates of the transistors T41, T42, T43, and T44.

Figure 2B:
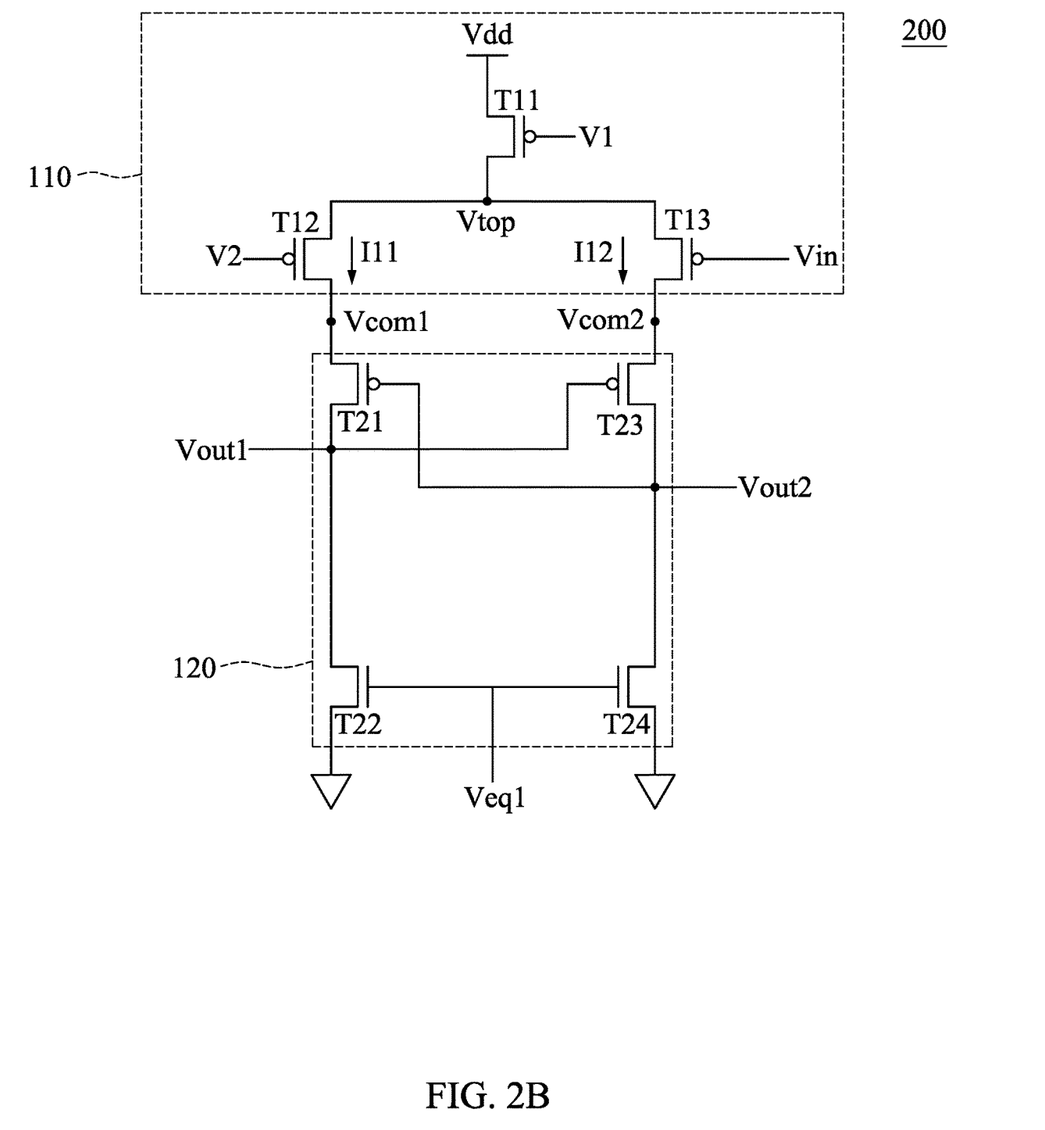
FIG. 2B illustrates an equivalent circuit of the data receiving circuit as shown in FIG. 2A, in accordance with some embodiments of the present disclosure.

In some embodiments, when the data receiving circuit 200 is configured to operate at an equalizing stage, the equalizer 430 is enabled. The equalizing signal Veq1 with a high logic level (e.g., logical value "1" or Vdd) is inputted to the gates of the transistors T41, T42, T43, and T44. The transistors T43 and T44 are turned on. The transistors T41 and T42 are turned off. The transistors T22 and T24 are turned on. The gate of the transistor T21 is connected to the common voltage (e.g., ground) through the transistor T24, and the transistor T21 is turned on. The gate of the transistor T23 is connected to the common voltage (e.g., ground) through the transistor T22, and the transistor T23 is turned on. The voltage Vcom1 and the voltage Vout1 are connected to the common voltage (e.g., ground) through the transistors T21 and T22. The voltage Vcom2 and the voltage Vout2 are connected to the common voltage (e.g., ground) through the transistors T23 and T24. FIG. 2B illustrates an equivalent circuit of the data receiving circuit 200 operating in the equalizing stage, in accordance with some embodiments of the present disclosure.

Figure 2C:
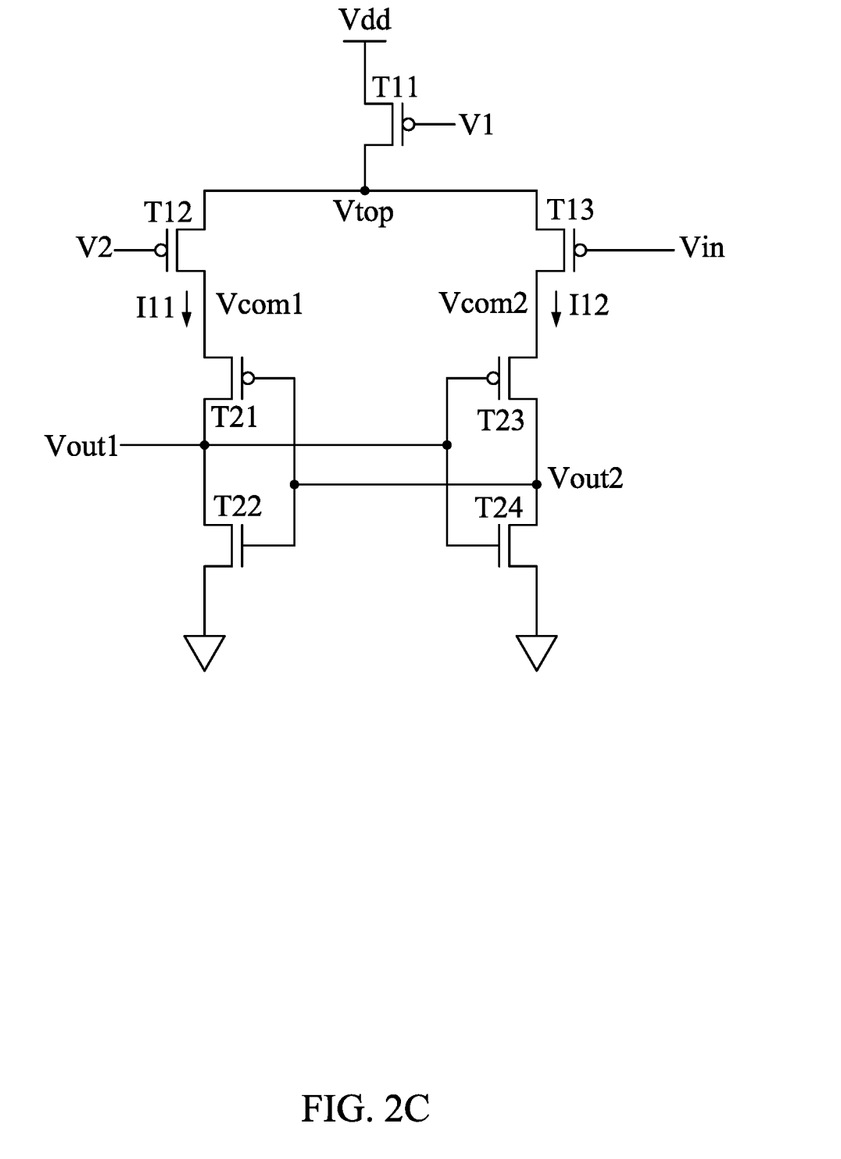
FIG. 2C illustrates an equivalent circuit of the data receiving circuit as shown in FIG. 2A, in accordance with some embodiments of the present disclosure.

After the equalizing stage is completed, the equalizing signal Veq1 with a low logic level (e.g., logical value "0") is inputted to the gates of the transistors T41, T42, T43, and T44 to turn off the transistors T43 and T44. The transistors T41 and T42 are tuned on. FIG. 2C illustrates an equivalent circuit of the data receiving circuit 200 operating in this stage, in accordance with some embodiments of the present disclosure.

In the case that an input signal Vin having a high logic level (e.g., logical value "1") is inputted to the gate of the transistor T13, the voltage Vtop at the drain of the transistor T11 (or at the source of the transistor T12 or T13) starts rising. For example, the voltage Vtop is pulled up. The voltage Vcom1 at the drain of the transistor T12 (or at the source of the transistor T21) starts rising as well. For example, the voltage Vcom1 is pulled up. The voltage Vcom2 at the drain of the transistor T13 (or at the source of the transistor T23) starts rising as well. For example, the voltage Vcom2 is pulled up.

Since the voltage (e.g., the input signal Vin) at the gate of the transistor T13 is higher than the voltage (e.g., the reference signal V2) at the gate of the transistor T12, a current I11 flowing through the transistor T12 is larger than a current I12 flowing through the transistor T13. After a sufficient period of time, the transistor T21 is fully turned on. Since the voltage at the gates of the transistors T21 and T22 has been pulled down to the common voltage (e.g., ground) during the equalizing stage, the transistors T21 and T24 are fully turned on and the transistors T22 and T23 are fully turned off. Therefore, the voltage Vout1 at the drains of the transistors T21 and T22 (or at the gates of the transistors T23 and T24) starts rising. For example, the voltage Vout1 is pulled up.

The data receiving circuit 200 is configured to output the voltage Vout1 having a high logic level (e.g., logical value "1") if the voltage of the input signal Vin is higher than the voltage of the reference signal V2; and the data receiving circuit 100 is configured to output the voltage Vout1 having a low logic level (e.g., logical value "0") if the voltage of the input signal Vin is lower than the voltage of the reference signal V2.

In the case that the equivalent resistance between the transistors T12 and T21 is equal to the equivalent resistance between the transistors T13 and T23, the voltages Vcom1 and Vcom2 would have the same voltage level (e.g., ground) at the equalizing stage.

In the case that the equivalent resistance between the transistors T12 and T21 is inconsistent with the equivalent resistance between the transistors T13 and T23 due to deviations in manufacturing processes, the voltages Vcom1 and Vcom2 would have different voltage levels at the equalizing stage. Such voltage difference can compensate for the equivalent rise in voltage level of the reference signal V2 caused by deviations in manufacturing processes. For example, if the equivalent resistance between the transistors T12 and T21 is 40Ω greater than the equivalent resistance between the transistors T13 and T23, the voltage Vcom1 would be 40 mV higher than the voltage Vcom2 at the equalizing stage. While the data receiving circuit 200 operates in the data input stage, such voltage difference (e.g., 40 mV) can be used to compensate for the lower value of the voltage Vcom1 (which is caused by a mismatch between the transistors T12 and T13), so as to obtain a better data eye of the output data of the data receiving circuit 200.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A data receiving circuit, comprising:
   a data input circuit configured to receive an input signal;
   a latch circuit connected to the data input circuit and configured to output an output signal in response to the input signal; and
   an equalizer comprising:
     a first transistor having a source connected to latch circuit;
     a second transistor having a source connected to the latch circuit and a gate connected to a gate of the first transistor;
     a third transistor having a source connected to a drain of the first transistor and a gate connected to the gate of the first transistor and the gate of the second transistor; and
     a fourth transistor having a source connected to a drain of the second transistor and a gate connected to the gate of the first transistor and the gate of the second transistor;
     wherein a drain of the third transistor is connected to the gates of the first transistor, the second transistor, the third transistor, and the fourth transistor, and a drain of the fourth transistor is connected to the gates of the first transistor, the second transistor, the third transistor, and the fourth transistor.

2. The data receiving circuit of claim 1, wherein the latch circuit further comprises:
   a fifth transistor having a source connected to a first node of the data input circuit and a gate connected to the source of the first transistor; and
   a sixth transistor having a source connected to a second node of the data input circuit and a gate connected to the source of the third transistor.

3. The data receiving circuit of claim 2, wherein the latch circuit further comprises:
   a seventh transistor having a drain connected to a drain of the fifth transistor, a source connected to ground, and a gate connected to the drain of the first transistor; and
   an eighth transistor having a drain connected to a drain of the sixth transistor, a source connected to ground, and a gate connected to the drain of the second transistor.

4. The data receiving circuit of claim 3, wherein the fifth transistor and the sixth transistor are P-type metal-oxide-semiconductor (PMOS) transistors, and the seventh transistor and the eighth transistor are N-type metal-oxide-semiconductor (NMOS) transistors.

5. The data receiving circuit of claim 4, wherein at the equalizing stage, the equalizer is configured to receive an equalizing signal having a higher logical value through the gates of the first transistor, the second transistor, the third transistor, and the fourth transistor.

6. The data receiving circuit of claim 5, wherein the equalizing signal is configured to turn on the third transistor and the fourth transistor and to turn off the first transistor and the second transistor.

7. The data receiving circuit of claim 6, wherein the seventh transistor and the eighth transistor are turned on.

8. The data receiving circuit of claim 2, wherein the equalizer is configured to provide different voltages at the first node and the second node.

9. The data receiving circuit of claim 1, wherein the data input circuit comprises a first input configured to receive a reference voltage and a second input configured to receive the input signal.

10. The data receiving circuit of claim 9, wherein the latch circuit is configured to output the output signal having a high logical value in the case that a voltage of the input signal is larger than the reference voltage.

11. The data receiving circuit of claim 9, wherein the latch circuit is configured to output the output signal having a low logical value in the case that a voltage of the input signal is less than the reference voltage.

* * * * *